(12) United States Patent
Chi et al.

(10) Patent No.: US 12,131,946 B2
(45) Date of Patent: Oct. 29, 2024

(54) METHOD TO FORM CONTACTS WITH MULTIPLE DEPTH BY ENHANCED CESL

(71) Applicant: SiEn (QingDao) Integrated Circuits Co., Ltd., Shandong (CN)

(72) Inventors: Min-Hwa Chi, Qingdao (CN); Zhaosheng Meng, Qingdao (CN); Xian Zhang, Qingdao (CN)

(73) Assignee: SiEn (QingDao) Integrated Circuits Co., Ltd., Qingdao (CN)

( * ) Notice: Subject to any disclaimer, the term of this patent is extended or adjusted under 35 U.S.C. 154(b) by 415 days.

(21) Appl. No.: 17/584,210

(22) Filed: Jan. 25, 2022

(65) Prior Publication Data
US 2022/0246470 A1 Aug. 4, 2022

(30) Foreign Application Priority Data
Feb. 2, 2021 (CN) .......................... 202110140864.3

(51) Int. Cl.
*H01L 21/768* (2006.01)
*H01L 21/311* (2006.01)
*H01L 29/40* (2006.01)

(52) U.S. Cl.
CPC .. *H01L 21/76877* (2013.01); *H01L 21/31133* (2013.01); *H01L 21/31138* (2013.01); *H01L 21/76802* (2013.01); *H01L 21/76829* (2013.01); *H01L 29/401* (2013.01)

(58) Field of Classification Search
CPC ......... H01L 21/76877; H01L 21/31133; H01L 21/31138; H01L 21/76802; H01L 21/76829; H01L 29/401
See application file for complete search history.

(56) References Cited

U.S. PATENT DOCUMENTS

| 2006/0172518 | A1* | 8/2006 | Frohberg | ............ H01L 21/0214 438/763 |
| 2006/0199370 | A1* | 9/2006 | Dai | .................. H01L 21/76808 257/E21.256 |
| 2006/0211238 | A1* | 9/2006 | Fujimoto | .......... H01L 21/31116 257/E21.252 |
| 2022/0051940 | A1* | 2/2022 | Lin | ....................... H01L 23/485 |

(Continued)

OTHER PUBLICATIONS

Allred et al., "Film redeposition on vertical surfaces during reactive ion etching", Journal of Vacuum Science & Technology B, May/Jun. 1989, pp. 505-511, vol. 7, No. 3.

(Continued)

*Primary Examiner* — Michael Jung
(74) *Attorney, Agent, or Firm* — Chen Yoshimura LLP

(57) ABSTRACT

The present invention relates to a method of forming contact holes of a CMOS device and a method of making a CMOS device. Because a carbon cap layer or a carbon rich layer is formed on a etching stop layer, when etching reaches the etching stop layer with less depth, great polymer protecting the etching stop layer from etching will be formed in the etching stop layer. As such, when etching reaches the contact holes with more depth, the contact holes with less depth may be protected from over-etching until etching the contact holes with more depth is finished. Over-etching may be avoided, and meanwhile the contact holes with more depth may be fully etched to avoid from under-etching.

8 Claims, 9 Drawing Sheets

(56) References Cited

U.S. PATENT DOCUMENTS

2023/0159864 A1* 5/2023 Sugishima ........ H01L 21/02071
                                                        438/706

OTHER PUBLICATIONS

Park et.al., "Modeling of Polymer Neck Generation and Its Effects on the Etch Profile for Oxide Contact Hole Etching Using Ar, CHF3, and CF4 Gases", SISPAD, 1997, pp. 285-287.
Boumerzoug et al., "A dry process for polymer sidewall residue removal after via-hole etching", 2000 IEEE/SEMI Advanced Semiconductor Manufacturing Conference and Workshop. ASMC 2000, 2000, pp. 281-286.

* cited by examiner

METHOD TO FORM CONTACTS WITH MULTIPLE DEPTH BY ENHANCED CESL

FIELD OF THE INVENTION

The present invention relates to semiconductor devices, and specially relates to a method of forming contact holes of a CMOS (Complementary Metal-Oxide-Semiconductor) device and a method of making a CMOS device.

BACKGROUND OF THE INVENTION

In a semiconductor device, contacts are usually formed on a gate and an active area (i.e. a source or a drain). In the CMOS, the contacts on the active area are usually with more depth than those on the gate. In other advanced technologies, such as FDSOI (Fully Depleted Silicon on Insulator) and 3D NAND, the contacts with different depth than those on the active area exist.

Currently, contact holes in a semiconductor device are usually formed with simultaneous etching. Then, because of different depths for the gate and the active area, the contact holes with less depth will be over-etched, and the contact holes with more depth will be under-etched. Either over-etching or under-etching will cause bad conductivity or short circuit in the device. Aiming such problem, for the contact holes with different depths, different etching masks may be used to performing several steps of etching; however, more cost will be needed. For those FDSOI and 3D NAND in which the contact holes have different depths, the problem is even severe.

Therefore, it is needed to develop a solution to solve the problems of over-etching and under-etching caused by the contact holes with different depths without increasing cost significantly.

SUMMARY OF THE INVENTION

In light of aforesaid problems and defects caused by contact holes with different depths in semiconductor devices, the present invention relates to a method of forming contact holes of a CMOS device and a method of making a CMOS device. After forming a device layer, an etching stop layer is formed on a gate and an active area of the device layer. A carbon cap layer is formed on the etching stop layer, or a carbon rich layer is formed at a surface of the etching stop layer with implementing carbon. Then, an interlayered dielectric layer is formed on the etching stop layer. Because the carbon cap layer or the carbon rich layer is formed on the etching stop layer, when etching reaches the etching stop layer with less depth, great polymer protecting the etching stop layer from etching will be formed in the etching stop layer. As such, when etching reaches the contact holes with more depth, the contact holes with less depth may be protected from over-etching until etching the contact holes with more depth is finished. Over-etching may be avoided, and meanwhile the contact holes with more depth may be fully etched to avoid from under-etching.

To fulfill aforesaid objects and other related objects, an aspect of the present invention provides a method of forming contact holes of a CMOS (Complementary Metal-Oxide-Semiconductor) device, comprising steps of: forming a device layer on a substrate, forming a device layer on the substrate, the device layer comprising a gate and an active area, the gate and the active area being positioned on different planes with different depths; forming an etching stop layer on the gate and the active area, the etching stop layer being the etching stop layer comprising carbon; forming an interlayered dielectric layer on the etching stop layer; etching the interlayered dielectric layer until forming contact holes on the etching stop layer; removing polymer formed at a bottom of the contact holes during the etching step; and keeping etching the etching stop layer until forming the contact holes on the gate and the active area.

Optionally, the step of forming an etching stop layer on the gate and the active area may comprise: forming a silicon nitride layer on the gate and the active area; and depositing a carbon cap layer on the silicon nitride layer.

Optionally, a thickness of the carbon cap layer may be less or equal to 1 nm.

Optionally, the step of forming an etching stop layer on the gate and the active area may comprise: forming a silicon nitride layer on the gate and the active area; and implementing carbon into the silicon nitride layer to form a carbon rich layer at a surface of a blocking layer.

Optionally, a content of the carbon implemented into the blocking layer may be between $1E15\ cm^{-2}$~$1E16\ cm^{-2}$, with an implementing energy which is less than 5 Kev.

Optionally, the step of removing polymer formed at a bottom of the contact holes during the etching step may comprise: performing dry etching with ions comprising chlorine.

Optionally, the step of removing polymer formed at a bottom of the contact holes during the etching step may comprise: performing wet etching with diluted hydrofluoric acid solution; and cleaning with deionized water.

Another aspect of the present invention provides a method of making a CMOS device, comprising steps of: forming contact holes at a gate and an active area according to the method of forming contact holes of a CMOS device of claim 1; and filling the contact holes with a conductive material to form contacts.

As mentioned above, the method of forming contact holes of a CMOS device and the method of making a CMOS device according to the present invention at least have benefits as follow: after forming the device layer, the etching stop layer is formed on the gate and the active area of the device layer. The carbon cap layer is formed on the etching stop layer, or carbon is implemented into the etching stop layer. Then, the interlayered dielectric layer is formed on the etching stop layer. Because the carbon cap layer is formed on the etching stop layer or the carbon exists in the etching stop layer, when etching the interlayered dielectric layer reaches the etching stop layer with less depth, great polymer may be generated in the etching stop layer. The polymer may protect the etching stop layer from keeping etching. As such, when the etching reaches the contact holes with more depth, the contact holes with less depth may be protected from over-etching until etching the contact holes with more depth is finished. The carbon cap layer on the etching stop layer or the carbon implemented into the etching stop layer may form the polymer during the etching, and the polymer may avoid the etching stop layer from keep etching and over-etching during etching the interlayered dielectric layer to form the contact holes with more depth. Meanwhile, the polymer may ensure the contact holes is fully etched to avoid from under-etching. Aforesaid methods may apply one single etching mask to perform a simultaneous etching step that etches the contact holes with different depths. Therefore, the steps may be simplified and the cost may be saved.

The method of making a CMOS device according to the present invention may apply one of the aforesaid methods to form the contact holes with different depths and then fill the contact holes with the conductive material to form the contacts. Then, other making process to make the CMOS devices may be performed. The method also has aforesaid benefits.

BRIEF DESCRIPTION OF THE DRAWINGS

Various objects and advantages of the present invention will be more readily understood from the following detailed description when read in conjunction with the appended drawing as follows.

DESCRIPTION OF EMBODIMENTS OF THE INVENTION

Reference is now made to the following concrete examples taken in conjunction with the accompanying drawings to illustrate implementation of the present invention. Persons of ordinary skill in the art having the benefit of the present disclosure will understand other advantages and effects of the present invention. The present invention may be implemented with other examples. For various view or application, details in the present disclosure may be used for variation or change for implementing embodiments within the scope of the present invention.

Please note that the drawings provided here are only for examples but not limited to the specific number or scale shown therein. When implementing the examples according to the drawings, condition, number, shape, size, relative position and proportion of each element may be changed and arrangement of the elements may be in a more complex way.

First Embodiment

Figure 1:
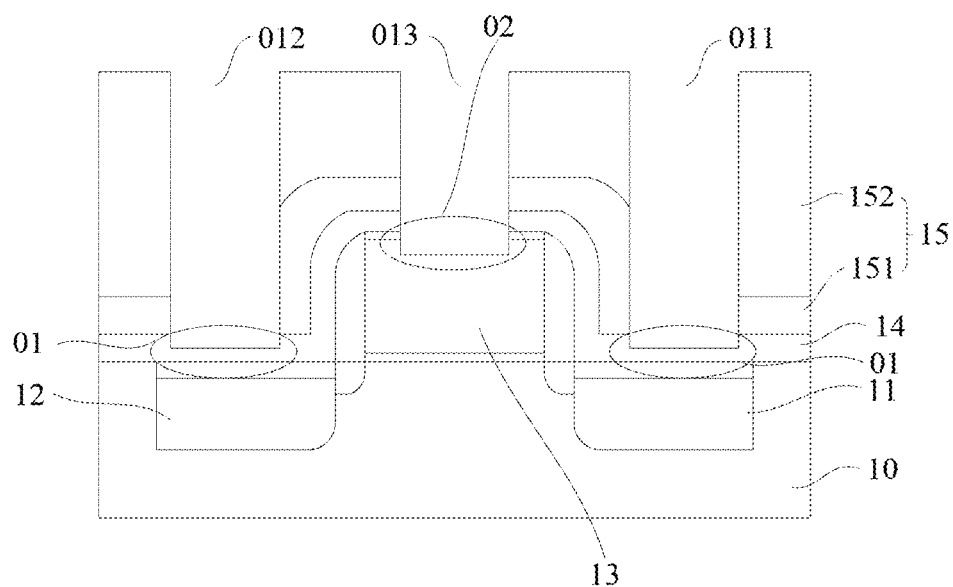
FIG. 1 shows a perspective view of a structure of contact holes with different depths in a conventional technology.

In a semiconductor device, contacts are usually formed on a gate and an active area (i.e. a source or a drain). As shown in FIG. 1, taking a CMOS device for example, a device layer is formed in a substrate 10. The device layer comprises a source 11 and a drain 12 in the substrate and a gate 13 on the substrate, and the source and the drain have a deeper depth than that of the gate. When etching an interlayered dielectric layer 15 on the device layer (usually comprising a multi-layer structure, for example, as shown in FIG. 1, comprising a first dielectric layer 151 and a second dielectric layer 152) and an etching stop layer 14 to form source contact holes 011, drain contact holes 012 and gate contact holes 013, simultaneous etching is usually performed. At this time, as shown in FIG. 1, over-etching 02 may occur at a bottom of the gate contact holes 013 with less depth, and under-etching 01 may occur at a bottom of the source contact holes 011 and the drain contact holes 012 with more depth. Either over-etching 02 or under-etching 01 will deteriorate conductivity of the contacts formed in the contact holes later to affect electrical characteristics of the devices.

Figure 2:
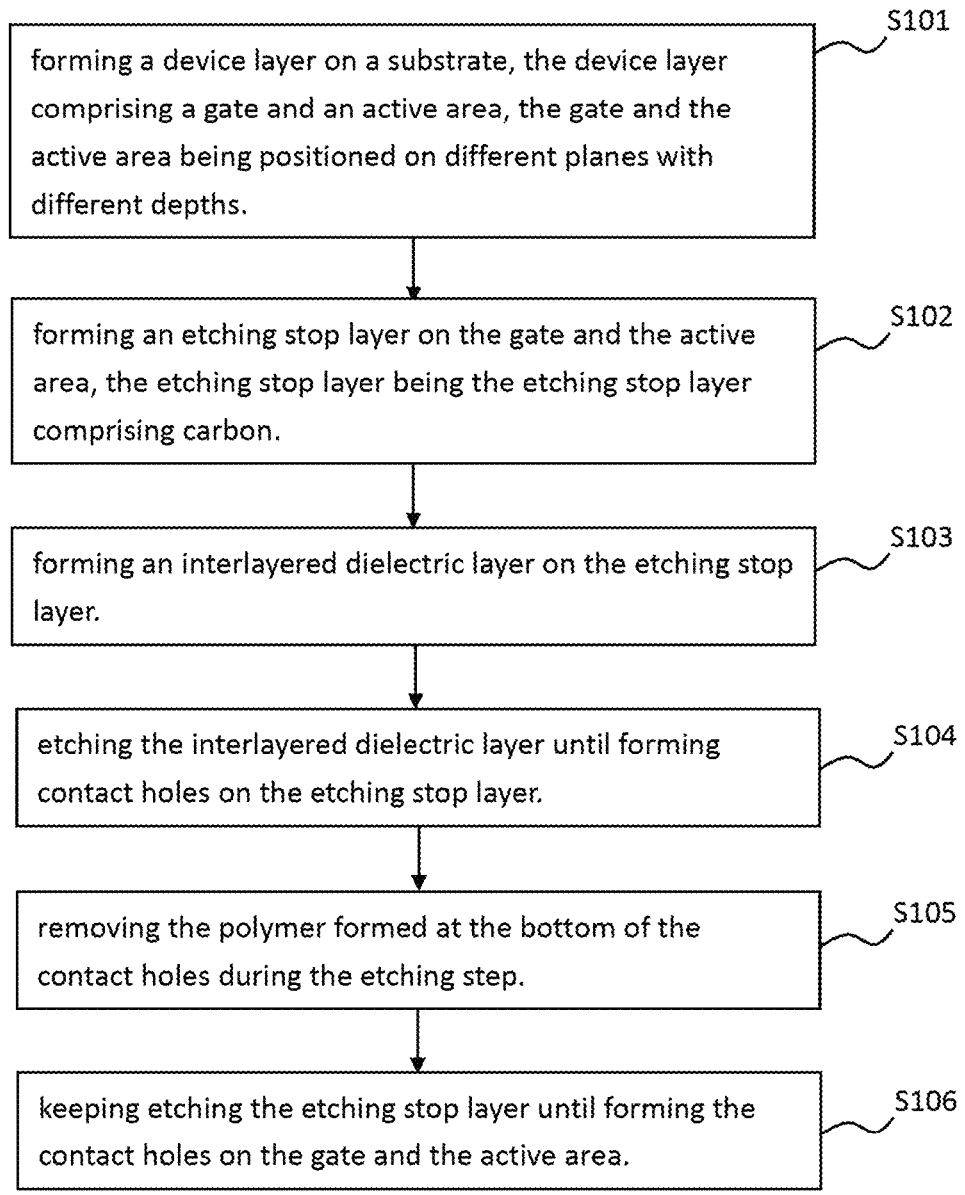
FIG. 2 shows a flow chart of a method of forming contact holes of a CMOS (Complementary Metal-Oxide-Semiconductor) device provided by a first embodiment of the present invention.
Figure 3:
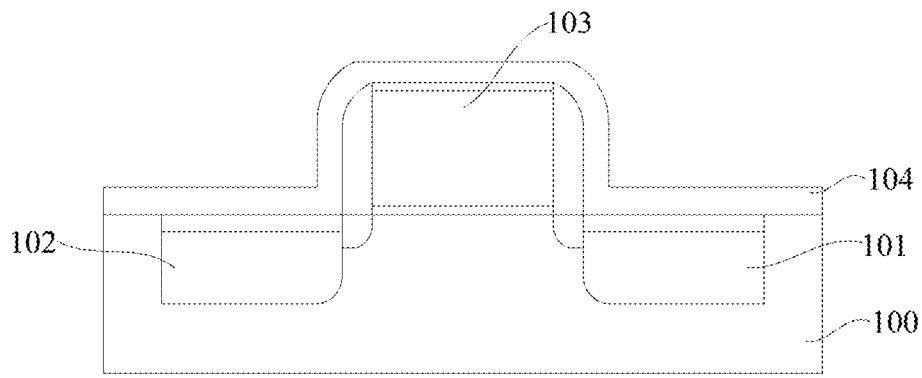
FIG. 3 shows a perspective view of a structure of an etching stop layer formed on a substrate with a device layer.

In light of aforesaid defects, the present embodiment provides a method of etching contact holes of a CMOS device. An etching stop layer comprising carbon is formed on the device layer to eliminate under-etching or over-etching. As shown in FIG. 2, the method comprises a step S101: forming a device layer on a substrate, the device layer comprising a gate and an active area, the gate and the active area being positioned on different planes with different depths. As shown in FIG. 3, the device layer is formed on the substrate 100. Taking a CMOS device for example, the device layer may comprise the active area and the gate 103, the active area may be a source 101 or a drain 102. The source 101 and the drain 102 may be formed in the substrate. As shown in FIG. 3, the source 101 and the drain 102 are formed below a surface of the substrate 100, and two gates 103 are formed on the substrate 100. The substrate 100 may be chosen to meet actual needs of the device, for instance, may comprise a silicon substrate, a geranium (Ge) substrate, a silicon geranium (SiGe) substrate, a SOI (Silicon-on-insulator) substrate or GOI (Germanium-on-Insulator) substrate, etc.

Figure 4:
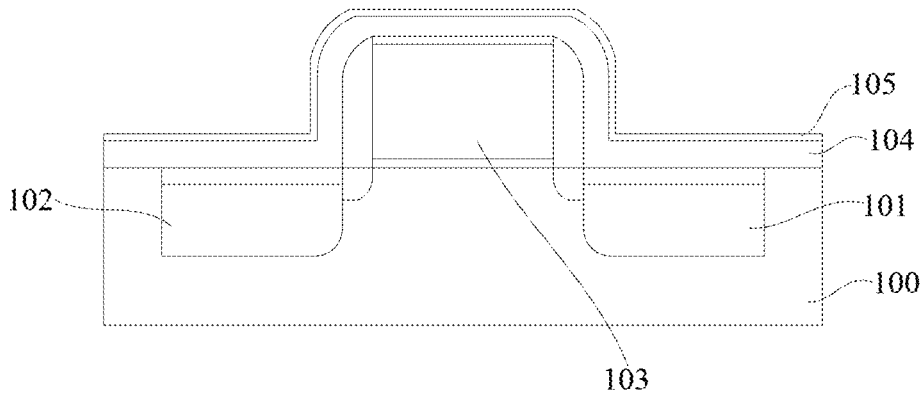
FIG. 4 shows a perspective view of a structure of a carbon cap layer formed on the etching stop layer shown in FIG. 3.

The method comprises a step S102: forming the etching stop layer on the gate and the active area, the etching stop layer being the etching stop layer comprising carbon. Through experiments, it is readily understood that in a dry etching process, a carbon-base polymer may assist in keeping appearance of material or film being etched in an anisotropic etching process. As such, the present invention uses the specific etching stop layer comprising carbon on the gate and the active area to stop etching when etching is performed to the etching stop layer and the carbon contained in the etching stop layer and etching gases form the carbon-base polymer. In the present embodiment, at first, as shown in FIG. 3, the etching stop layer 104 is formed on the gate and the active area, and the etching stop layer may be a SiN layer, multi-layer of SiN and $SiO_2$. Then, as shown in FIG. 4, a thin layer of carbon cap layer 105 is formed on the etching stop layer 104. CVD (chemical vapor deposition), ALD (Atomic Layer Deposition) or PVD (Physical Vapor Deposition) may be used to deposit carbon on the etching stop layer to form the carbon cap layer 105. Preferably, a thickness of the carbon cap layer 105 may be less than or equal to 1 nm.

The method comprises a step S103: forming an interlayered dielectric layer on the etching stop layer.

Figure 5:
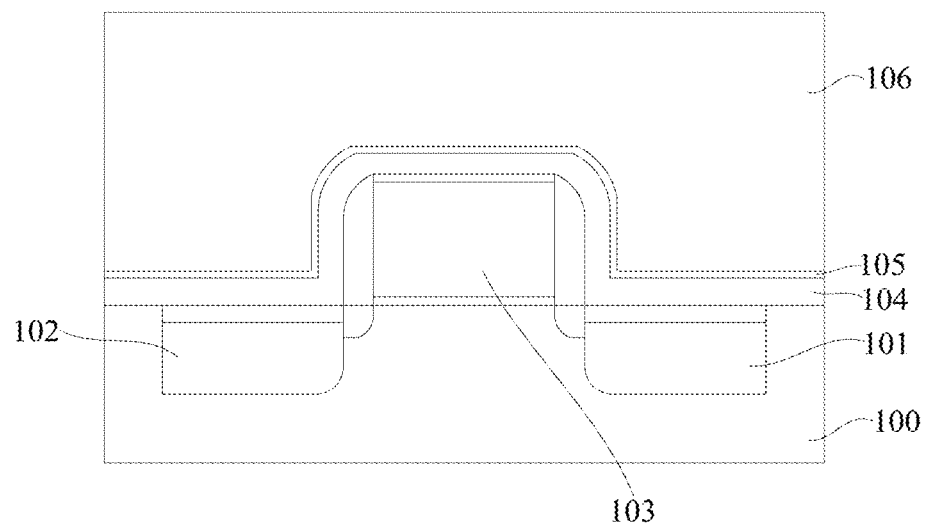
FIG. 5 shows a perspective view of a structure of an interlayered dielectric layer formed on the structure shown in FIG. 4.
Figure 6:
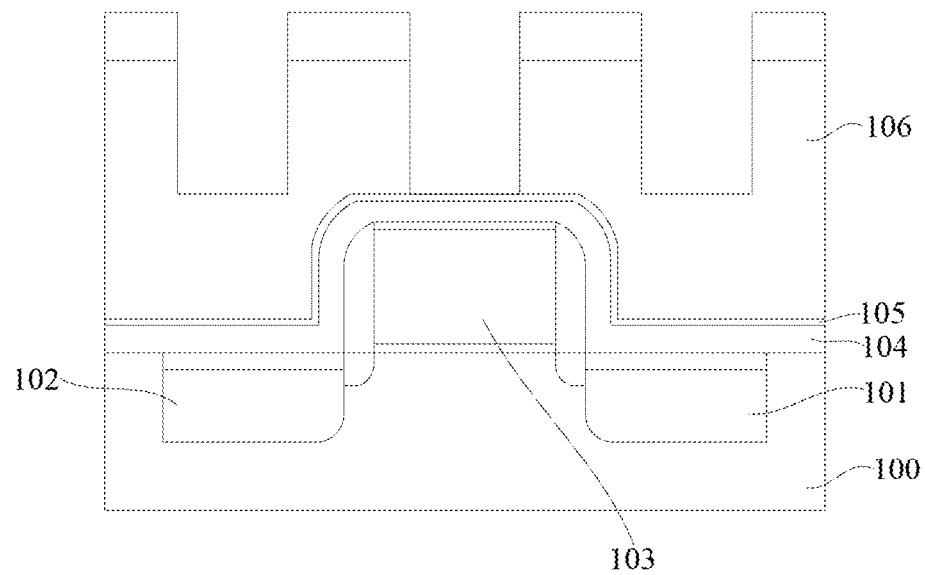
FIG. 6 shows a perspective view of a structure in which the interlayered dielectric layer is etched until the carbon cap layer on a gate under shielding of a mask.
Figure 7:
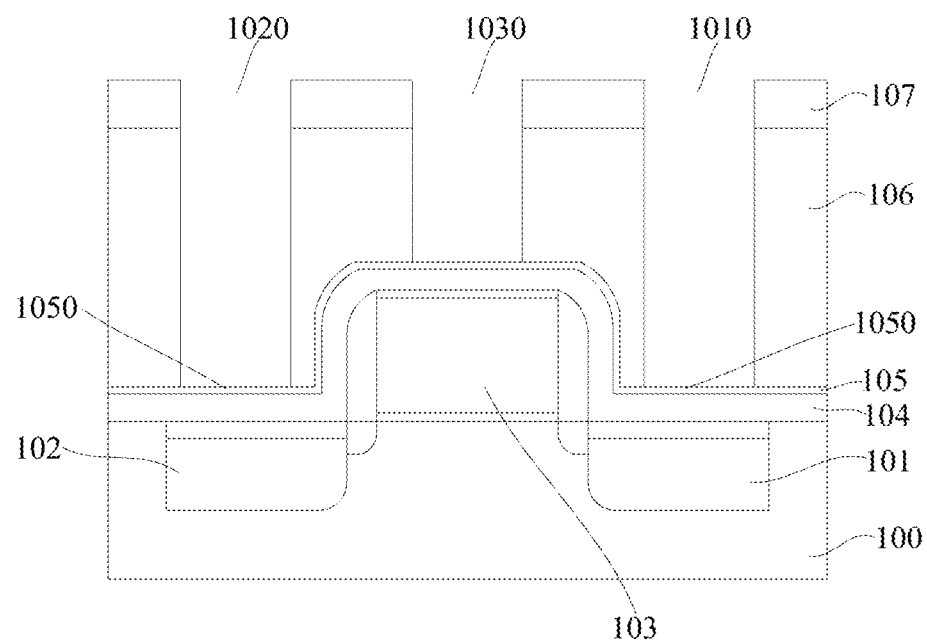
FIG. 7 shows a perspective view of a structure in which the etching of the interlayered dielectric layer shown in FIG. 6 keeps until forming the carbon cap layer on a source and a drain.

The method comprises a step S104: etching the interlayered dielectric layer until forming contact holes on the etching stop layer. As shown in FIG. 5, after forming the carbon cap layer 105, the interlayered dielectric layer may be deposited on the carbon cap layer 105, and the interlayered dielectric layer may be a $SiO_2$ layer. Then, as shown in FIG. 6, a mask layer 107 may be formed on the interlayered dielectric layer. The mask layer 107 may be formed through performing steps of: forming an APF layer (Advanced Patterning Film), a DARC (Dielectric Anti-reflective Coating), BARC (Bottom Anti-reflective Coating) and a photoresist layer on the interlayered dielectric layer sequentially; then, performing an exposure process, through photolithograph technology, forming a patterned photoresist layer; etching the APF layer through the patterned photoresist layer, and forming the mask layer 107 has a pattern of the contact holes. Namely, as shown in FIG. 6, with shielding of the mask layer 107, the interlayered dielectric layer is etched. At first, the etching is performed to the carbon cap layer 105 with less depth, i.e. the carbon cap layer on the gate 103 to form the gate contact holes 1030 shown in FIG. 6. A dry etching process may be used to etch the interlayered dielectric layer, and an etching gas may be that containing C or F. At this time, the etching gas may act on the carbon cap layer 105 at a bottom of the gate contact holes with less depth to form great carbon-base polymer which may inhibit the etching. Then, as shown in FIG. 7, the etching of the interlayered dielectric layer may be performed to the carbon cap layer 105 on the source 101 and the drain 102, with more depth, to form the source contact holes 1010 and the drain contact holes 1020. During etching the interlayered dielectric layer, the carbon-base polymer formed in the carbon cap layer on the gate 103 avoids from the etching stop layer 104 on the gate 103 being etched to effectively protect the etching stop layer on the gate 10. As such, when etching the interlayered dielectric layer with more depth, the etching stop layer with less depth may be protected, and over-etching or under-etching during may be avoided during etching the etching stop layer.

Figure 8:
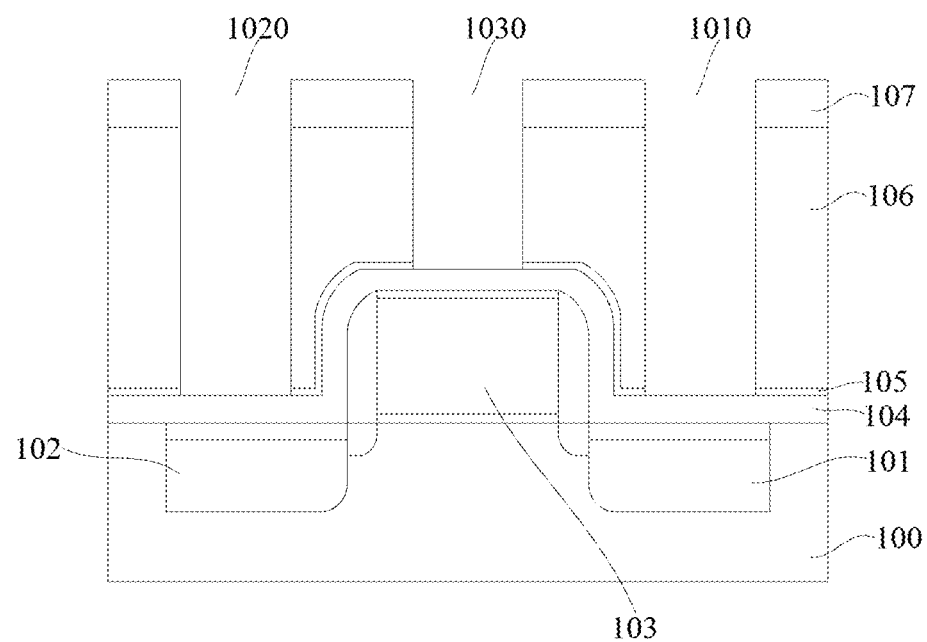
FIG. 8 shows a perspective view of a structure in which a polymer at a bottom of the contact holes shown in FIG. 7 is removed.

The method comprises a step S105: removing the polymer formed at the bottom of the contact holes during the etching step. As mentioned above, the carbon-base polymer at the bottom of each contact hole will stop etching the etching stop layer. Therefore, before etching the etching stop layer shown in FIG. 8, the carbon-base polymer at the bottom of the contact holes is removed first to form the source contact holes 1010, the drain contact holes 1020 and the gate contact holes 1030 shown in FIG. 8, comprising the etching stop layer 104. Aforesaid carbon-base polymer may be removed with a dry etching or a wet etching process. For example, a dry etching may be performed with applying ions containing Cl for etching to remove the carbon-base polymer; a wet etching may be performed with a diluted HF solution to corrode the carbon-base polymer, and then cleaning with deionized water to fully remove the carbon-base polymer at the bottom of the contact holes. Aforesaid HF solution may be diluted solution in a ratio of 50:1.

Figure 9:
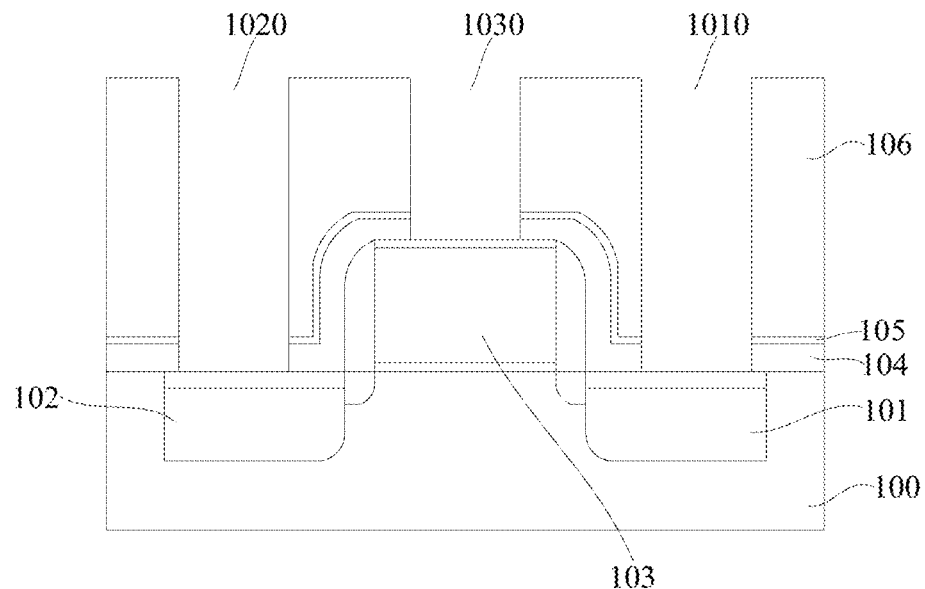
FIG. 9 shows a perspective view of a structure in which the etching stop layer on the device layer is etched until forming the contact holes.

The method comprises a step S106: keeping etching the etching stop layer until forming the contact holes on the gate and the active area. After removing the carbon-base polymer at the bottom of the contact holes exposing the etching stop layer 104, the source contact holes 1010, the drain contact holes 1020 and the gate contact holes 1030 shown in FIG. 9 are formed in the etching stop layer 104 on the source, the drain and the gate. As shown in FIG. 4, because the carbon cap layer is formed on the etching stop layer, the carbon cap layer may effectively protect the etching stop layer during etching the carbon-base polymer to eliminate over-etching or under-etching caused by etching the contact holes with different depths. As such, electrical characteristics of the devices may be promoted.

Second Embodiment

The present embodiment provides a method of etching contact holes of a CMOS device. An etching stop layer comprising carbon is formed on a device layer to eliminate under-etching or over-etching. Here, the same details as those of the method disclosed in the first embodiment are not repeated again. The differences are: in the step S102, the etching stop layer is formed on the gate and the active area. When the etching stop layer is the etching stop layer comprising carbon, a carbon rich layer 205 is formed on a surface of the etching stop layer. Specifically, ion implementation is applied to implement carbon ions in the surface of the etching stop layer with an implementing content being between 1E15 cm−2~1E16 cm−2 and an implementing energy being less than 5 Kev. A thickness of the formed carbon rich layer 205 is less than or equal to 1 nm.

Figure 11:
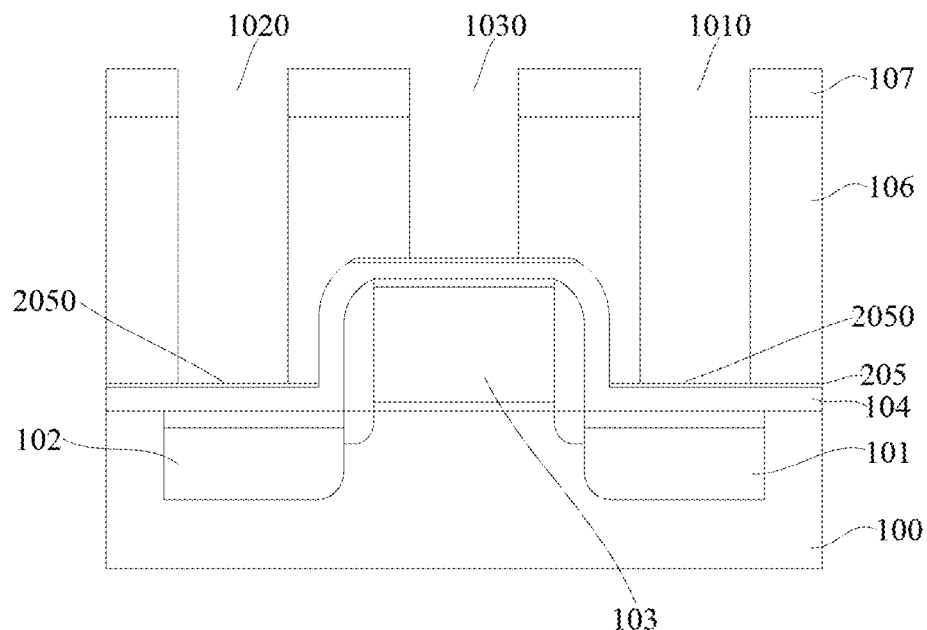
FIG. 11 shows a perspective view of a structure in which each contact hole is formed under shielding of a mask when etching the interlayered dielectric layer.
Figure 12:
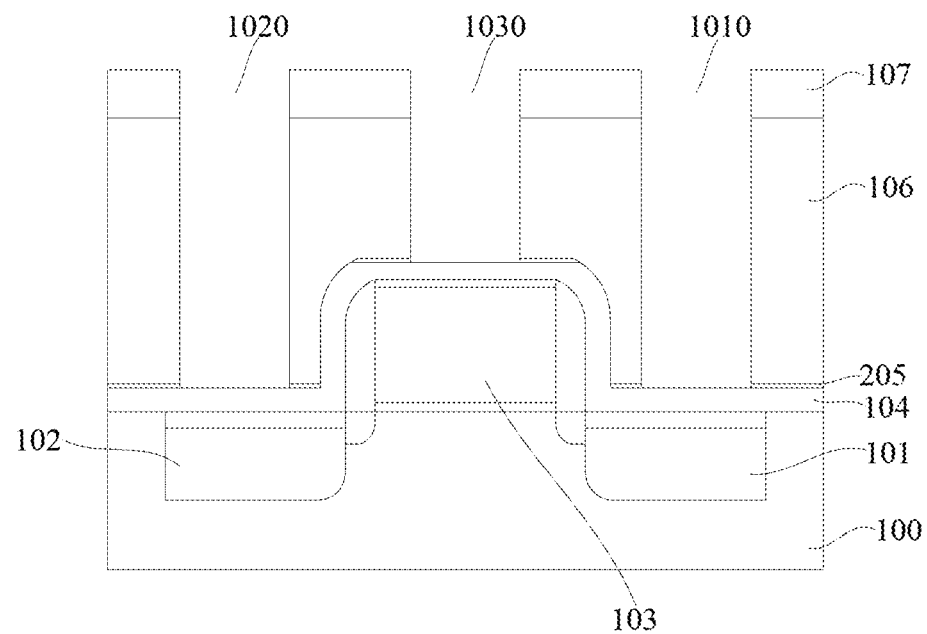
FIG. 12 shows a perspective view of a structure in which a polymer at a bottom of a hole structure shown in FIG. 11 is removed.
Figure 13:
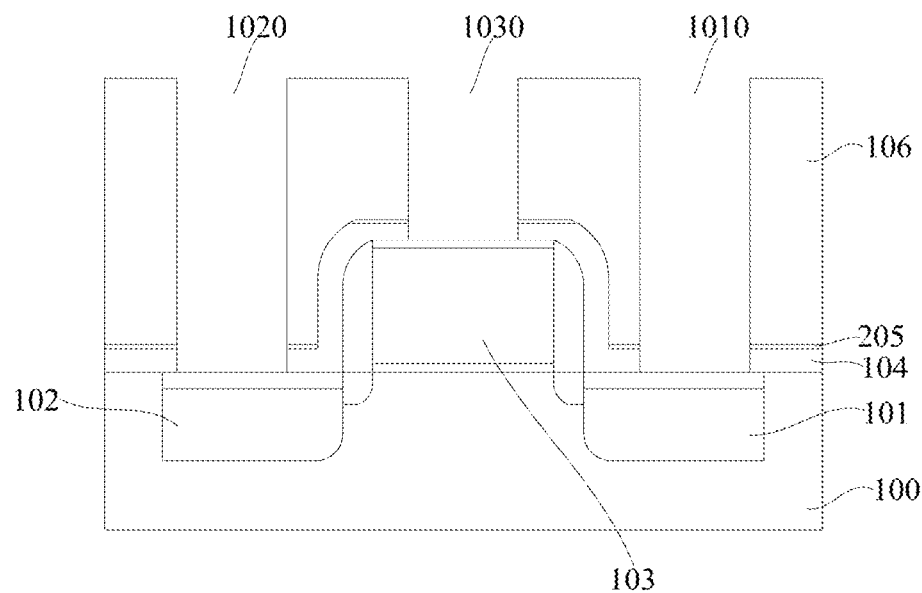
FIG. 13 shows a perspective view of a structure in which the contact holes is formed when etching the etching stop layer on the device layer.

After forming the carbon rich layer 205, similarly, the interlayered dielectric layer 106 and the mask layer 107 are formed on the etching stop layer. With shielding of the mask layer 107, the interlayered dielectric layer is etched to form the gate contact holes 1030 with less depth and the source contact holes 1010 and the drain contact holes 1020, both of which have more depth, as shown in FIG. 11. In source contact holes with more depth, a polymer comprising carbon is formed similarly at the carbon rich layer 205, at the bottom of the contact holes, to avoid from the etching stop layer with less depth on the gate being etched or ruined. Then, as shown in FIG. 12, the polymer comprising carbon at the bottom of the contact holes is similarly removed to expose the etching stop layer 104 at the bottom of the contact holes. As shown in FIG. 13, etching the etching stop layer 104 on the gate and the source and the drain is kept until fully forming the gate contact holes 1030, the source contact holes 1010 and the drain contact holes 1020.

Figure 10:
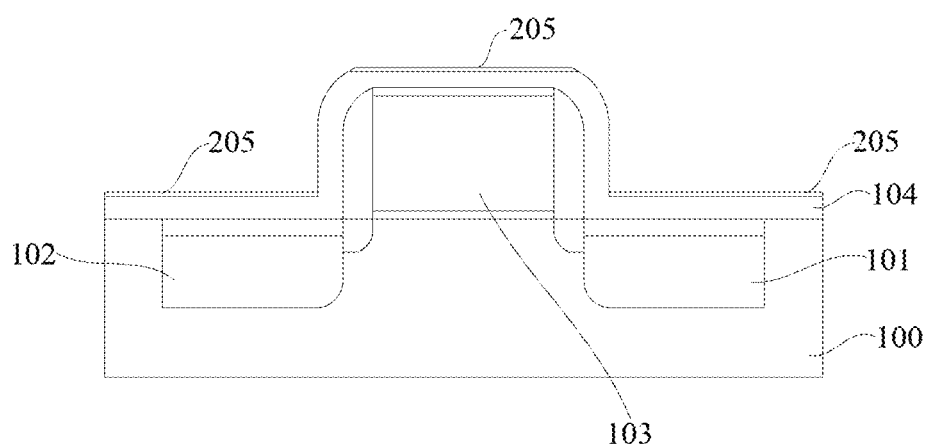
FIG. 10 shows a perspective view of a structure in which a carbon rich layer is formed at a surface of an etching stop layer according to a method of forming contact holes of a CMOS device provided by a second embodiment of the present invention.

As shown in FIG. 10, because the carbon rich layer at the surface of the etching stop layer is formed with implementing carbon in the etching stop layer, the polymer comprising carbon formed in the carbon rich layer during etching may effectively protect the etching stop layer to eliminate over-etching or under-etching due to different depths of the contact holes. As such, the electrical characteristics of the devices may be promoted.

Third Embodiment

The present embodiment provides a method of making a CMOS device. The method comprises a first step of forming a device layer on a substrate through front-end processes. Taking a CMOS device for example, a device layer comprises a gate 103, a source 101 and a drain 102.

Figure 14:
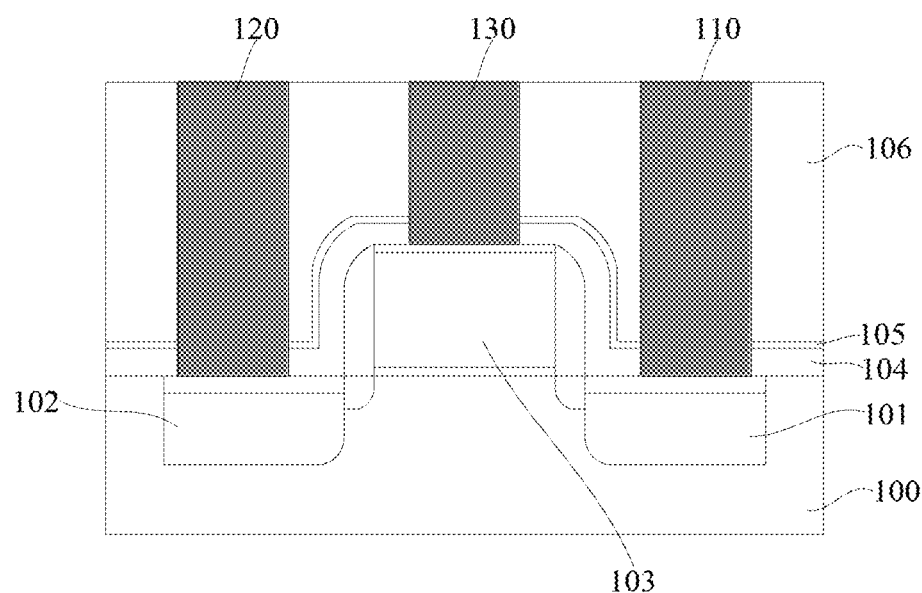
FIG. 14 shows a perspective view of a structure in which contacts are formed by filling the contact holes with a conductive material according to a method of forming a CMOS device provided by a third embodiment of the present invention.

Then, the etching method for the contact holes disclosed in the first embodiment is applied. The gate contact holes 1030, the source contact holes 1010 and the drain contact holes 1020 are formed on the device layer. Forming aforesaid contact holes may refer to the method in the first embodiment and is not repeated here. Then, as shown in FIG. 14, each contact hole is filled with a conductive material to form the gate the contacts 130, the source the contacts 110 and the drain the contacts 120. In a preferred embodiment, the conductive material may be tungsten, copper, silver, etc.

Because defects of over-etching or under-etching no longer exist in the formed contact holes with different depths, after forming the contacts with filling with the conductive material, the devices have good electrical characteristics.

Fourth Embodiment

The present embodiment provides a method of making a CMOS device. The method comprises a first step of forming a device layer on a substrate through front-end processes. Taking a CMOS device for example, a device layer comprises a gate 103, a source 101 and a drain 102.

Figure 15:
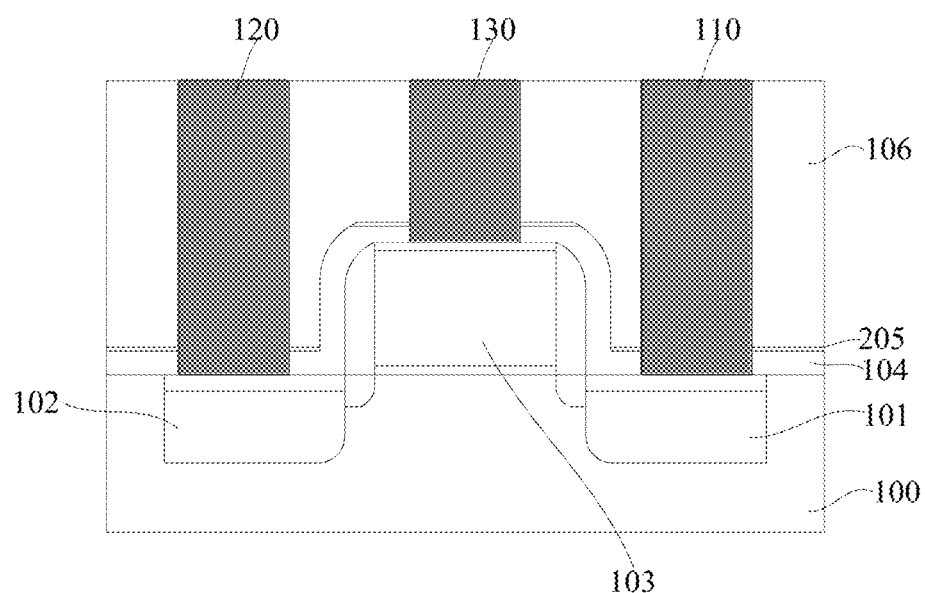
FIG. 15 shows a perspective view of a structure in which contacts are formed by filling the contact holes with a conductive material according to a method of forming a CMOS device provided by a fourth embodiment of the present invention.

Then, the etching method for the contact holes disclosed in the second embodiment is applied. The gate contact holes 1030, the source contact holes 1010 and the drain contact holes 1020 are formed on the device layer. Forming aforesaid contact holes may refer to the method in the second embodiment and is not repeated here. Then, as shown in FIG. 15, each contact hole is filled with a conductive material to form the gate the contacts 130, the source the contacts 110 and the drain the contacts 120. In a preferred embodiment, the conductive material may be tungsten, copper, silver, etc.

Because defects of over-etching or under-etching no longer exist in the formed contact holes with different depths, after forming the contacts with filling with the conductive material, the devices have good electrical characteristics.

As mentioned above, the method of forming contact holes of a CMOS device and the method of making a CMOS device according to the present invention at least have benefits as follow: after forming the device layer, the etching stop layer is formed on the gate and the active area of the device layer. The carbon cap layer is formed on the etching stop layer, or carbon is implemented into the etching stop layer. Then, the interlayered dielectric layer is formed on the etching stop layer. Because the carbon cap layer is formed on the etching stop layer or the carbon exists in the etching stop layer, when etching the interlayered dielectric layer reaches the etching stop layer with less depth, great polymer may be generated in the etching stop layer. The polymer may protect the etching stop layer from keeping etching. As such, when the etching reaches the contact holes with more depth, the contact holes with less depth may be protected from over-etching until etching the contact holes with more depth is finished. The carbon cap layer on the etching stop layer or the carbon implemented into the etching stop layer may form the polymer during the etching, and the polymer may avoid from keep etching the etching stop layer and over-etching during etching the interlayered dielectric layer to form the contact holes with more depth. Meanwhile, the polymer may ensure the contact holes is fully etched to avoid from under-etching. Aforesaid methods may apply one single etching mask to perform a simultaneous etching step that etches the contact holes with different depths. Therefore, the steps may be simplified and the cost may be saved.

The method of making a CMOS device according to the present invention may apply one of the aforesaid methods to form the contact holes with different depths and then fill the contact holes with the conductive material to form the contacts. Then, other making process to make the CMOS devices may be performed. The method also has aforesaid benefits.

It is to be understood that these embodiments are not meant as limitations of the invention but merely exemplary descriptions of the invention. Indeed, different adaptations may be apparent to those skilled in the art without departing from the scope of the annexed claims.

What is claimed is:

1. A method of forming contact holes of a CMOS (Complementary Metal-Oxide-Semiconductor) device, comprising steps of:
    forming a device layer on a substrate, the device layer comprising a gate and an active area, the gate and the active area being positioned on different planes with different depths;
    forming an etching stop layer on the gate and the active area;
    forming a carbon cap layer on the etching stop layer or forming or a carbon rich layer at a surface of the etching stop layer;
    forming an interlayered dielectric layer on the carbon cap layer or the carbon rich layer;
    etching the interlayered dielectric layer with at least one etching gas until forming a first part of the contact holes on the etching stop layer, wherein at least one of the first part of the contact holes, which is on the gate, has a depth less than that of at least another one of the first part of the contact holes, which is on the active area, and polymer is formed at a bottom of the at least one of the first part of the contact holes, which is on the gate, when the at least one etching gas acts on the carbon cap layer or the carbon rich layer;
    removing the polymer; and
    keeping etching the etching stop layer until forming a second part of the contact holes on the gate and the active area, the contact holes comprising the first and second parts of the contact holes.

2. The method according to claim 1, wherein the step of forming an etching stop layer on the gate and the active area comprises:
    forming a silicon nitride layer on the gate and the active area; and
    the step of forming a carbon cap layer on the etching stop layer comprises:
    depositing the carbon cap layer on the silicon nitride layer.

3. The method according to claim 1, wherein a thickness of the carbon cap layer is less or equal to 1 nm.

4. The method according to claim 1, wherein the step of forming an etching stop layer on the gate and the active area comprises:
    forming a silicon nitride layer on the gate and the active area; and
    the step of forming or a carbon rich layer at a surface of the etching stop layer comprises:
    implementing carbon into the silicon nitride layer to form the carbon rich layer at a surface of a blocking layer.

5. The method according to claim 4, wherein a content of the carbon implemented into the blocking layer is between $1E15$ $cm^{-2}$~ $1E16$ $cm^{-2}$, with an implementing energy which is less than 5 Kev.

6. The method according to claim 1, wherein the step of removing the polymer comprises:
performing dry etching with ions comprising chlorine.

7. The method according to claim 1, wherein the step of removing the polymer comprises:
performing wet etching with diluted hydrofluoric acid solution; and
cleaning with deionized water.

8. A method of making a CMOS (Complementary Metal-Oxide-Semiconductor) device, comprising steps of:
forming contact holes at a gate and an active area according to the method of forming contact holes of a CMOS device of claim 1; and
filling the contact holes with a conductive material to form contacts.

* * * * *